US008902596B2

(12) United States Patent
Kim et al.

(10) Patent No.: US 8,902,596 B2
(45) Date of Patent: Dec. 2, 2014

(54) DATA STORAGE DEVICE

(75) Inventors: Young-Hoon Kim, Cheonan-si (KR); Dong-Chun Lee, Asan-si (KR); Jae-Hoon Choi, Cheonan-si (KR); Hyung-Mo Hwang, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 252 days.

(21) Appl. No.: 13/424,858

(22) Filed: Mar. 20, 2012

(65) Prior Publication Data

US 2012/0244726 A1 Sep. 27, 2012

(30) Foreign Application Priority Data

Mar. 21, 2011 (KR) ........................ 10-2011-0024705

(51) Int. Cl.
*H05K 1/14* (2006.01)
*H01R 12/70* (2011.01)
*H01R 12/71* (2011.01)

(52) U.S. Cl.
CPC .......... *H01R 12/7005* (2013.01); *H01R 12/718* (2013.01)
USPC ............................ 361/736; 361/776; 361/721

(58) Field of Classification Search
USPC ......... 361/776, 777, 803, 720, 760, 721, 748; 439/951, 55, 65, 324
See application file for complete search history.

(56) References Cited

U.S. PATENT DOCUMENTS

| | | | | |
|---|---|---|---|---|
| 4,835,345 A * | 5/1989 | Haarde | 174/263 |
| 6,266,120 B1 * | 7/2001 | Han | 349/150 |
| 6,764,344 B2 * | 7/2004 | Maiers | 439/629 |
| 6,884,085 B1 * | 4/2005 | Goldstone | 439/62 |
| 6,908,330 B2 * | 6/2005 | Garrett et al. | 439/378 |
| 7,403,257 B2 * | 7/2008 | Shin et al. | 349/152 |
| 7,660,131 B2 * | 2/2010 | Drouillard et al. | 361/784 |
| 2004/0108985 A1 * | 6/2004 | Song | 345/87 |
| 2006/0052006 A1 | 3/2006 | Amano et al. | |
| 2006/0077633 A1 | 4/2006 | Fukuta | |
| 2010/0087094 A1 | 4/2010 | Chen et al. | |

FOREIGN PATENT DOCUMENTS

| | | |
|---|---|---|
| JP | 11-238536 A | 8/1999 |
| JP | 2006-073481 A | 3/2006 |

* cited by examiner

*Primary Examiner* — Hung S Bui
(74) *Attorney, Agent, or Firm* — Harness, Dickey & Pierce, P.L.C.

(57) ABSTRACT

A data storage device includes a printed circuit board (PCB), a connection tab, a dummy tab and a guiding member. A memory chip is mounted on the PCB. The connection tab is formed on a first surface of the PCB to electrically connect the PCB with a first cable. The dummy tab is formed on the first surface of the PCB. The guiding member is formed on the dummy tab to guide an insertion direction of the first cable. Thus, the data storage device without a separate connector may be manufactured by a relatively simple process at a lower cost.

18 Claims, 6 Drawing Sheets

DATA STORAGE DEVICE

CROSS-RELATED APPLICATION

This application claims priority under 35 USC §119 to Korean Patent Application No. 2011-24705, filed on Mar. 21, 2011 in the Korean Intellectual Property Office (KIPO), the contents of which are herein incorporated by reference in their entirety.

BACKGROUND

1. Field

Some example embodiments relate to a data storage device and a method of manufacturing the same. More particularly, some example embodiments relate to a data storage device such as a portable hard disk drive, and a method of manufacturing the data storage device.

2. Description of the Related Art

Generally, as information generation has developed, an amount of portable data of a user may be increased. Thus, various kinds of data storage devices for storing the data have been developed.

A typical example of the data storage device may include a hard disk drive. The hard disk drive may have merits such as a higher write density, a rapid data transmission speed, a faster data access time, a lower price, etc. Thus, the hard disk drive has been widely used. However, because the hard disk drive may have a complicated mechanical structure, troubles may be generated in the hard disk drive due to a weaker impact, a weaker vibration, etc.

Recently, a solid state drive having a flash memory may be widely used in place of the hard disk drive. The solid state drive may not have a different mechanical structure from the hard disk drive. Therefore, the solid state drive may have a shorter drive time and a shorter delay time compared to the hard disk drive. Particularly, because the solid state drive may have a stronger structure with respect to external impacts, the solid state drive may be widely used as the data storage device.

An advanced technology attachment (ATA) interface as an interface for transmitting data between the solid state drive and a host may be used. The ATA interface may be classified into a parallel-ATA (PATA) type interface and a serial-ATA (SATA) type interface. The SATA interface may have a transmission speed faster than that of the PATA interface. Thus, the SATA interface may be mainly used.

The solid state drive may be connected with the host via a SATA cable. Thus, the solid state drive may include a printed circuit board (PCB) including memory chips, and a connector mounted on the PCB. The SATA cable may be inserted into the connector. The connector may have a guide configured to guide an insertion direction of the SATA cable.

Recently, the solid state drive may include a connector integrally formed with the PCB. That is, the solid state drive may not include a separate connector. However, although tabs making contact with the SATA cable may be readily formed, the guide may not be readily formed due to complicated processes, a relatively high cost, etc.

SUMMARY

Some example embodiments provide a data storage device without a separate connector that may be manufactured at a lower cost. Other example embodiments also provide a method of manufacturing the above-mentioned data storage device.

According to some example embodiments, there is provided a data storage device. The data storage device includes a printed circuit board (PCB), a first connection tab, a first dummy tab and a first guiding member. A memory chip is mounted on the PCB. The first connection tab is formed on a first surface of the PCB to electrically connect the PCB with a first cable. The first dummy tab is formed on the first surface of the PCB. The first guiding member is formed on the first dummy tab to guide an insertion direction of the first cable.

In some example embodiments, the first dummy tab may include a material substantially the same as that of the first connection tab.

In some example embodiments, the first cable may include a serial advanced technology attachment (SATA) cable. The first guiding member may include a pair of guides arranged adjacent to each other. Alternatively, the first cable may include a micro serial advanced technology attachment (μ-SATA) cable. The first guiding member may include a pair of guides arranged at both sides of the first connection tab.

In some example embodiments, the data storage device may further include a second connection tab and a second dummy tab. The second connection tab may be formed on a second surface of the PCB opposite to the first surface to electrically connect the PCB with a second cable different from the first cable. The second dummy tab may be formed on the second surface of the PCB. The data storage device may further include a second guiding member. The second guiding member may be selectively formed on the second dummy tab to guide an insertion direction of the second cable. The first cable may include a SATA cable. The second cable may include a μ-SATA cable.

In some example embodiments, the data storage device may further include a housing formed at the PCB to receive the first cable.

According to some example embodiments, there is provided a data storage device. The data storage device includes a printed circuit board (PCB), a first connection tab, a first dummy tab, a first guiding member, a second connection tab, a second dummy tab and a second guiding member. A memory chip is mounted on the PCB. The first connection tab is formed on a first surface of the PCB to electrically connect the PCB with a serial advanced technology attachment (SATA) cable. The first dummy tab is formed on the first surface of the PCB. The first guiding member is selectively formed on the first dummy tab to guide an insertion direction of the SATA cable. The second connection tab is formed on a second surface of the PCB opposite to the first surface to electrically connect the PCB with a micro serial advanced technology attachment (μ-SATA) cable. The second dummy tab is formed on the second surface of the PCB. The second guiding member is selectively formed on the second dummy tab to guide an insertion direction of the μ-SATA cable.

In some example embodiments, the data storage device may further include a housing formed at the PCB to receive the SATA cable and the μ-SATA cable.

According to some example embodiments, there is provided a data storage device. The data storage device includes a printed circuit board (PCB) and a connector. A memory chip is mounted on the PCB. The connector is integrally formed with the PCB to electrically connect the PCB with a serial advanced technology attachment (SATA) cable. The connector includes a guiding member for guiding an insertion direction of the SATA cable.

In some example embodiments, the connector may include a connection tab and a dummy tab. The connection tab may be formed on the PCB. The connection tab may be electrically connected to the SATA cable. The dummy tab may be formed on the PCB. The guiding member may be formed on the dummy tab.

According to some example embodiments, there is provided a data storage device. The data storage device includes a printed circuit board (PCB) and a connector. A memory chip is mounted on the PCB. The connector is integrally formed with the PCB to electrically connect the PCB with a micro serial advanced technology attachment (μ-SATA) cable. The connector includes a guiding member for guiding an insertion direction of the μ-SATA cable.

In some example embodiments, the connector may include a connection tab and a dummy tab. The connection tab may be formed on the PCB. The connection tab may be electrically connected to the μ-SATA cable. The dummy tab may be formed on the PCB. The guiding member may be formed on the dummy tab.

According to some example embodiments, there is provided a method of manufacturing a data storage device. In the method of manufacturing the data storage device, a first connection tab is formed on a first surface of a printed circuit board (PCB) to electrically connect the PCB with a first cable. A first dummy tab is formed on the first surface of the PCB. A first guiding member for guiding an insertion direction of the first cable is formed on the first dummy tab.

In some example embodiments, the first connection tab and the first dummy tab may be formed simultaneously. Simultaneously forming the first connection tab and the first dummy tab may include a conductive layer on the first surface of the PCB, and patterning the conductive layer to form the first connection tab and the first dummy tab.

In some example embodiments, the method further include forming a second connection tab on a second surface of the PCB opposite to the first surface to electrically connect the PCB with a second cable different from the first cable, and forming a second dummy tab on the second surface of the PCB. Further, the method may further include selectively forming a second guiding member for guiding an insertion direction of the second cable on the second dummy tab.

In some example embodiments, the method may further include forming a housing on the PCB to receive the first cable.

According to some example embodiments, there is provided a method of manufacturing a data storage device. In the method of manufacturing the data storage device, a printed circuit board (PCB) is provided including a memory chip mounted thereon, and a connector is formed integrally with the PCB to electrically connect the PCB with at least one of a serial advanced technology attachment (SATA) cable and a micro serial advanced technology attachment (μ-SATA) cable. Forming the connector includes forming a guiding member to guide an insertion direction of the at least one of the SATA cable and the μ-SATA cable.

In some example embodiments, forming the connector includes forming a connection tab on the PCB to electrically connect the PCB with the at least one of the SATA cable and the μ-SATA cable, forming a dummy tab on the PCB, and forming the guiding member on the dummy tab.

According to some example embodiments, there is provided a method of manufacturing a data storage device. In the method of manufacturing the data storage device, a first connection tab and a first dummy tab are formed simultaneously on a first surface of a printed circuit board (PCB), and a first guiding member is formed on the first dummy tab to guide an insertion direction of a first cable. The first connection tab electrically connects the PCB with the first cable, and the first guiding member guides an insertion direction of the first cable. The first guiding member is made of an insulating material.

In some example embodiments, the insulating material may be an epoxy molding compound (EMC). In some example embodiments, forming the first connection tab and the first dummy tab includes forming a conductive layer on the first surface of the PCB, and patterning the conductive layer to form the first connection tab and the first dummy tab.

In some example embodiments, a second connection tab and a second dummy tab may be formed simultaneously on a second surface of the PCB opposite to the first surface. The second connection tab may electrically connect the PCB with a second cable different from the first cable. A second guiding member may be selectively formed on the second dummy tab to guide an insertion direction of the second cable. The second guiding member may be made of the insulating material.

According to some example embodiments, there is provided a data storage device. The data storage device includes a printed circuit board (PCB), a first connection tab, a first dummy tab and a first guiding member. The first connection tab and the first dummy tab are simultaneously formed on a first surface of a PCB, and the first guiding member may be formed on the dummy tab. The first connection tab is configured to electrically connect the PCB with a first cable. The first guiding member is made of an insulating material and configured to guide an insertion direction of the first cable.

In some example embodiments, the first dummy tab may include a material substantially the same as that of the first connection tab. The first cable may include a serial advanced technology attachment (SATA) cable, and the first guiding member may include a pair of guides arranged adjacent to each other. The first cable may include a micro serial advanced technology attachment (μ-SATA) cable, and the first guiding member may include a pair of guides arranged at both sides of the first connection tab.

In some example embodiments, a second connection tab and a second dummy tab may be formed on a second surface of the PCB opposite to the first surface, and a second guiding member may be selectively formed on the second dummy tab. The second connection tab may be configured to electrically connect the PCB with a second cable different from the first cable. The second guiding member may be configured to guide an insertion direction of the second cable. The first cable may include a serial advanced technology attachment (SATA) cable, and the second cable may include a micro serial advanced technology attachment (μ-SATA) cable.

According to some example embodiments, the guiding member may be readily formed by arranging an insulating layer on the dummy tab. Thus, the data storage device without a separate connector may be manufactured by a relatively simple process at a lower cost.

BRIEF DESCRIPTION OF THE DRAWINGS

Example embodiments will be more clearly understood from the following detailed description taken in conjunction with the accompanying drawings.

FIG. 1 is a perspective view illustrating a data storage device in accordance with an example embodiment;

FIG. 2 is a cross-sectional view illustrating the data storage device in FIG. 1;

FIGS. 3 to 6 are cross-sectional views a method of manufacturing the data storage device in FIG. 1;

FIG. 7 is a perspective view illustrating a data storage device in accordance with another example embodiment;

FIG. 8 is a cross-sectional view illustrating the data storage device in FIG. 7;

FIGS. 9 to 12 are cross-sectional views a method of manufacturing the data storage device in FIG. 7;

FIG. 13 is a cross-sectional view illustrating a data storage device in accordance with another example embodiment; and FIG. 14 is a cross-sectional view illustrating a data storage device in accordance with another example embodiment.

DETAILED DESCRIPTION OF EXAMPLE EMBODIMENTS

Figure 1:
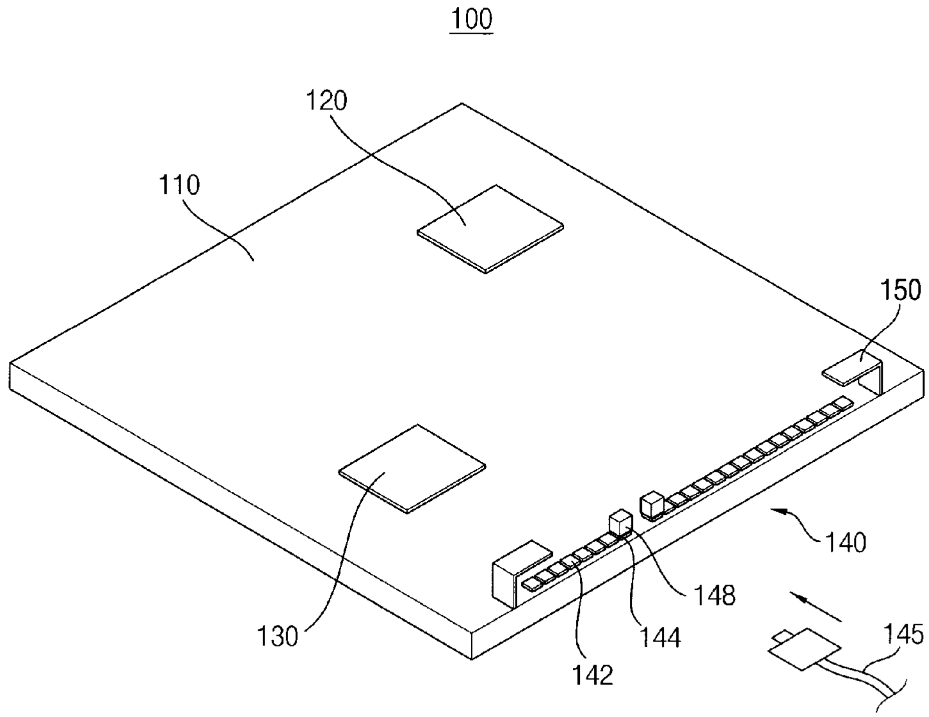
FIGS. 1 to 14 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
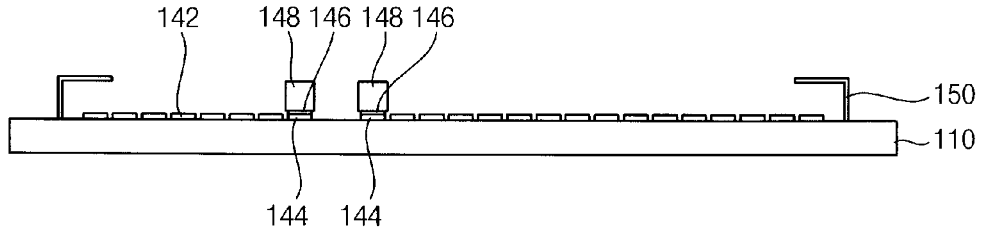

FIG. 1 is a perspective view illustrating a data storage device in accordance with an example embodiment, and FIG. 2 is a cross-sectional view illustrating the data storage device in FIG. 1.

Referring to FIGS. 1 and 2, a data storage device 100 of this example embodiment may include a PCB 110 and a connector 140.

In some example embodiments, the data storage device 100 may include a non-volatile memory device such as a portable hard disk drive. For example, the data storage device 100 may include a solid state drive (SSD) including a NANA flash memory.

The PCB 110 may include circuit patterns (not shown). Memory chips 120 such as the NAND flash memory chip may be mounted on a first surface of the PCB 110. A controller chip 130 may be mounted on the first surface of the PCB 110. The memory chips 120 and the controller chip 130 may be electrically connected with the circuit patterns of the PCB 110.

The connector 140 may be arranged on an edge portion of the first surface of the PCB 110. The connector 140 may electrically connect the PCB 110 with a host (not shown) such as a computer. Thus, a cable 145 may be inserted into the connector 140. The cable 145 may be electrically connected to the circuit patterns of the PCB 110.

In some example embodiments, the cable 145 may include a (SATA) serial advanced technology attachment cable. The SATA cable may include a plurality of tabs and a guiding slot. The tabs may be electrically connected with the circuit patterns of the PCB via the connector 140. The guiding slot may be configured to receive a guiding member 148 of the connector 140 to guide an insertion direction of the SATA cable into the connector 140. The guiding slot of the SATA cable may have a shape in accordance with a standard. The guiding slot of the SATA cable may include a pair of slots arranged adjacent to each other.

In some example embodiments, the connector 140 may be integrally formed with the PCB 110. That is, the connector 140 may not correspond to a separate part mounted on the PCB 110. The connector 140 may include a plurality of connection tabs 142, dummy tabs 144 and a guiding member 148.

The connection tabs 142 may be arranged on an edge portion of the first surface of the PCB 110. The connection tabs 142 may be electrically connected with the circuit patterns of the PCB 110. The connection tabs 142 may electrically make contact with the tabs of the SATA cable.

The dummy tabs 144 may be arranged on the edge portion of the first surface of the PCB 110. In some example embodiments, the dummy tabs 144 may include a pair of tabs between the connection tabs 142. Positions of the dummy tabs 144 may correspond to those of the guiding slots in the SATA cable. The dummy tabs 144 may include a material substantially the same as that of the connection tabs 142. For example, the connection tabs 142 and the dummy tabs 144 may include copper. Further, the dummy tabs 144 may be formed simultaneously with the connection tabs 142. That is, the dummy tabs 144 may not be formed by processes different from those for forming the connection tabs 142. Thus, the dummy tabs 144 may correspond to portions of the connection tabs 142. The dummy tabs 144 may not have a function as an electrical medium between the data storage device 100 and the host, so that the dummy tabs 144 may not be electrically connected with the circuit patterns of the PCB 110. Alternatively, because the dummy tabs 144 may not be electrically connected with the tabs of the SATA cable, the dummy tabs 144 may be electrically connected with the circuit patterns of the PCB 110.

A pair of the guiding members 148 may be formed on the dummy tabs 144. The guiding members 148 may be inserted into the guiding slots of the SATA cable to guide the insertion direction of the SATA cable. Therefore, positions and shapes of the guiding members 148 may correspond to those of the guiding slots of the SATA cable. In some example embodiments, the guiding members 148 may be attached to the dummy tabs 144 using a solder joint 146. The guiding members 148 may include an insulating material such as an epoxy molding compound (EMC).

Additionally, a housing 150 may be formed on the first surface of the PCB 110. The housing 150 may be configured to receive the SATA cable. The housing 150 may function as to readily insert the guiding members 148 into the guiding slots of the SATA cable.

In some example embodiments, the cable may include the SATA cable. Thus, the dummy tabs 144 and the guiding members 148 may have the shapes corresponding to that of the SATA cable. Alternatively, the connector 140 including the dummy tabs 144 and the guiding members 148, which may be integrally formed with the PCB 110, may be applied to other cables.

Figure 3:
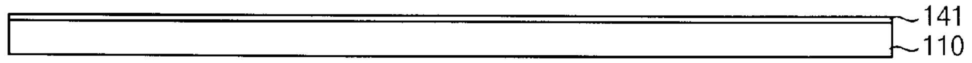

FIGS. 3 to 6 are cross-sectional views a method of manufacturing the data storage device in FIG. 1. Referring to FIG. 3, a conductive layer 141 may be formed on the first surface of the PCB 110. In some example embodiments, the conductive layer 141 may include a copper layer.

Figure 4:

Referring to FIG. 4, the conductive layer 141 may be patterned to simultaneously form the connection tabs 142 and the dummy tabs 144. In some example embodiments, a photoresist pattern (not shown) may be formed on the conductive layer 141. The conductive layer 141 may be etched using the photoresist pattern an etch mask to simultaneously form the connection tabs 142 and the dummy tabs 144. The dummy tabs 144 may include a pair of tabs adjacent to each other corresponding to a standard of the SATA cable. The connection tabs 142 may be electrically connected with the circuit pattern of the PCB 110. In contrast, the dummy tabs 144 may be electrically isolated from the circuit pattern of the PCB 110.

Figure 5:
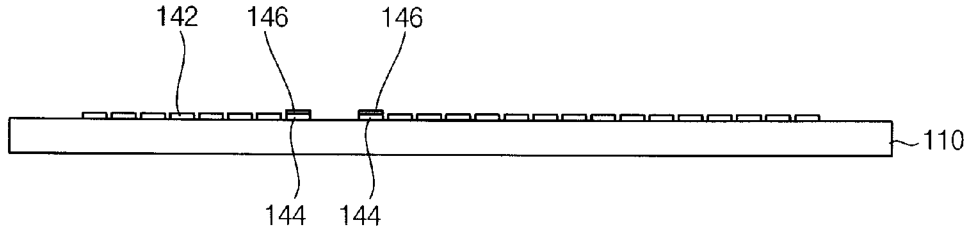

Referring to FIG. 5, the adhesive 146 may be formed on the dummy tabs 144. In some example embodiments, the adhesive 146 may include a solder joint.

Figure 6:
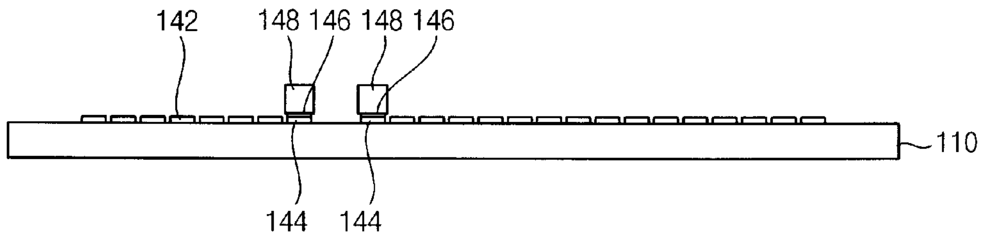

Referring to FIG. 6, the guiding members 148 may be attached to the dummy tabs 144 using the adhesive 146. In some example embodiments, the guiding members 148 may include an insulating material such as an EMC. The guiding members 148 may be configured to be inserted into the guiding slots of the SATA cable.

The housing 150 configured to receive the SATA cable may be formed on the first surface of the PCB 110 to complete the data storage device 100 in FIG. 1.

According to this example embodiment, the guiding member for guiding the insertion direction of the SATA cable may be readily formed by arranging the insulating material on the dummy tabs simultaneously formed with the connection tabs. Thus, the data storage device including the integrated connection may be manufactured by a relatively simple process at a lower cost.

Figure 7:
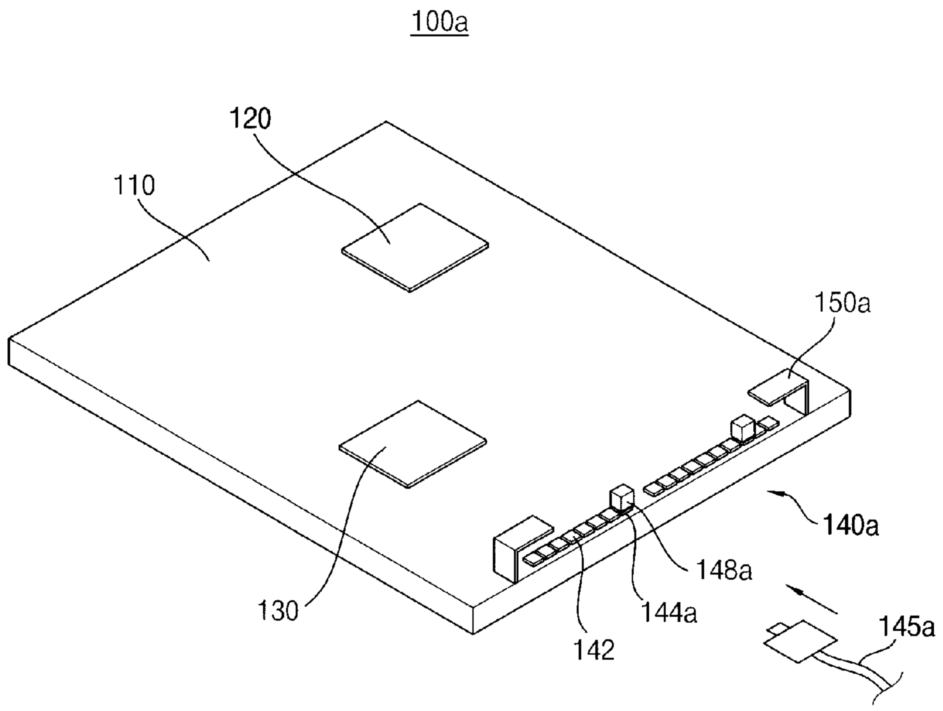
Figure 8:
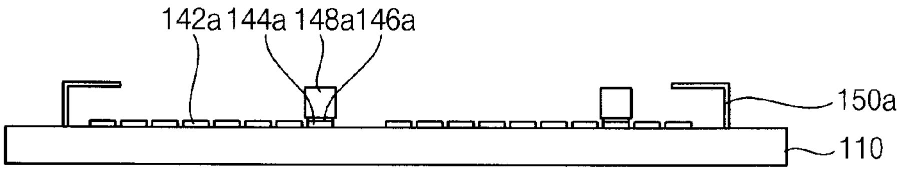

FIG. 7 is a perspective view illustrating a data storage device in accordance with some example embodiments, and FIG. 8 is a cross-sectional view illustrating the data storage device in FIG. 7.

A data storage device 100*a* of this example embodiment may include elements substantially the same as those of the data storage device 100 in FIG. 1 except for a connector. Thus, the same reference numerals may refer to the same elements and any further illustrations with respect to the same elements may be omitted herein for brevity.

Referring to FIGS. 7 and 8, the data storage device 100*a* of this example embodiment may include the PCB 110 and a connector 140*a*.

The connector 140*a* may be arranged on the edge portion of the first surface of the PCB 110. A cable 145*a* may be inserted into the connector 140*a*. The cable 145*a* may be electrically connected to the circuit patterns of the PCB 110.

In some example embodiments, a cable 145*a* may include a μ-SATA cable. The μ-SATA cable may include a plurality of tabs and a guiding slot. The tabs may be electrically connected with the circuit patterns of the PCB via the connector 140*a*. The guiding slot may be configured to receive a guiding member 148*a* of the connector 140*a* to guide an insertion direction of the μ-SATA cable into the connector 140*a*. The guiding slot of the μ-SATA cable may have a shape in accordance with a standard. The guiding slot of the SATA cable may include a pair of slots arranged far away from each other.

In some example embodiments, the connector 140*a* may be integrally formed with the PCB 110. That is, the connector 140*a* may not correspond to a separate part mounted on the PCB 110. The connector 140*a* may include a plurality of connection tabs 142*a*, dummy tabs 144*a* and a guiding member 148*a*.

The connection tabs 142*a* may be arranged on the edge portion of the first surface of the PCB 110. The connection tabs 142*a* may be electrically connected with the circuit patterns of the PCB 110. The connection tabs 142*a* may electrically make contact with the tabs of the μ-SATA cable.

The dummy tabs 144*a* may be arranged on the edge portion of the first surface of the PCB 110. In some example embodiments, the dummy tabs 144*a* may include a pair of tabs positioned at both sides of the connection tabs 142*a*. Positions of the dummy tabs 144*a* may correspond to those of the guiding slots in the μ-SATA cable. The dummy tabs 144*a* may include a material substantially the same as that of the connection tabs 142*a*. For example, the connection tabs 142*a* and the dummy tabs 144*a* may include copper. Further, the dummy tabs 144*a* may be formed simultaneously with the connection tabs 142*a*. The dummy tabs 144*a* may not have a function as an electrical medium between the data storage device 100*a* and the host, so that the dummy tabs 144*a* may not be electrically connected with the circuit patterns of the PCB 110.

A pair of the guiding members 148*a* may be formed on the dummy tabs 144*a*. The guiding members 148*a* may be inserted into the guiding slots of the μ-SATA cable to guide the insertion direction of the μ-SATA cable. Therefore, positions and shapes of the guiding members 148*a* may correspond to those of the guiding slots of the μ-SATA cable. In some example embodiments, the guiding members 148*a* may be attached to the dummy tabs 144*a* using a solder joint 146*a*. The guiding members 148*a* may include an insulating material such as an epoxy molding compound (EMC).

In some example embodiments, the cable may include the μ-SATA cable. Thus, the dummy tabs 144*a* and the guiding members 148*a* may have the shapes corresponding to that of the μ-SATA cable. Alternatively, the connector 140*a* including the dummy tabs 144*a* and the guiding members 148*a*, which may be integrally formed with the PCB 110, may be applied to other cables.

Additionally, a housing 150*a* may be formed on the first surface of the PCB 110. The housing 150*a* may be configured to receive the μ-SATA cable. The housing 150*a* may function so as to readily insert the guiding members 148*a* into the guiding slots of the ii-SATA cable.

FIGS. 9 to 12 are cross-sectional views a method of manufacturing the data storage device in FIG. 7.

Figure 9:
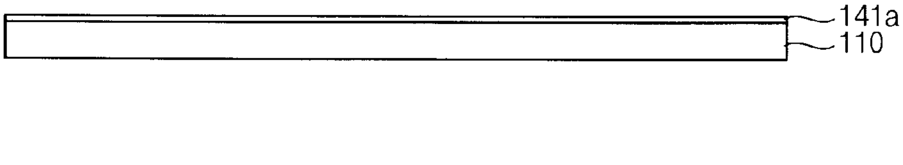

Referring to FIG. 9, a conductive layer 141*a* may be formed on the first surface of the PCB 110. In some example embodiments, the conductive layer 141*a* may include a copper layer.

Figure 10:
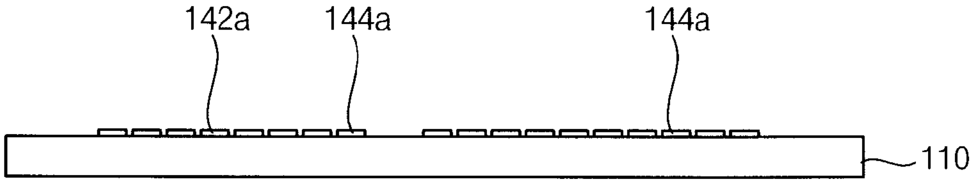

Referring to FIG. 10, the conductive layer 141*a* may be patterned to simultaneously form the connection tabs 142*a* and the dummy tabs 144*a*. In some example embodiments, a photoresist pattern (not shown) may be formed on the conductive layer 141*a*. The conductive layer 141*a* may be etched using the photoresist pattern an etch mask to simultaneously form the connection tabs 142*a* and the dummy tabs 144*a*. The dummy tabs 144*a* may include a pair of tabs positioned at both sides of the connection tabs 142*a* corresponding to a standard of the μ-SATA cable. The connection tabs 142*a* may be electrically connected with the circuit pattern of the PCB 110. In contrast, the dummy tabs 144*a* may be electrically isolated from the circuit pattern of the PCB 110.

Figure 11:
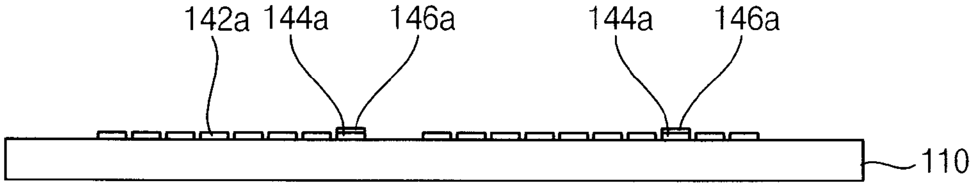

Referring to FIG. 11, the adhesive 146*a* may be formed on the dummy tabs 144*a*. In some example embodiments, the adhesive 146*a* may include a solder joint.

Figure 12:
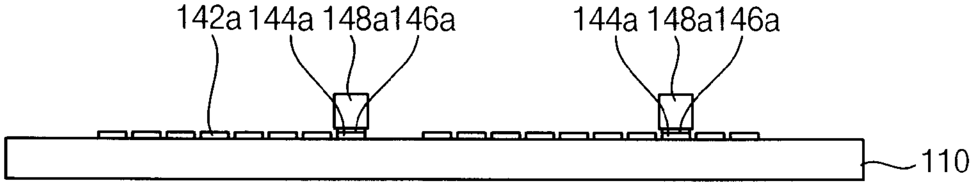

Referring to FIG. 12, the guiding members 148*a* may be attached to the dummy tabs 144*a* using the adhesive 146*a*. In some example embodiments, the guiding members 148*a* may include an insulating material such as an EMC. The guiding members 148*a* may be configured to be inserted into the guiding slots of the μ-SATA cable.

The housing 150*a* configured to receive the μ-SATA cable may be formed on the first surface of the PCB 110 to complete the data storage device 100 in FIG. 7.

According to this example embodiment, the guiding member for guiding the insertion direction of the μ-SATA cable may be readily formed by arranging the insulating material on the dummy tabs simultaneously formed with the connection tabs. Thus, the data storage device including the integrated connection may be manufactured by a relatively simple process at a lower cost.

Figure 13:
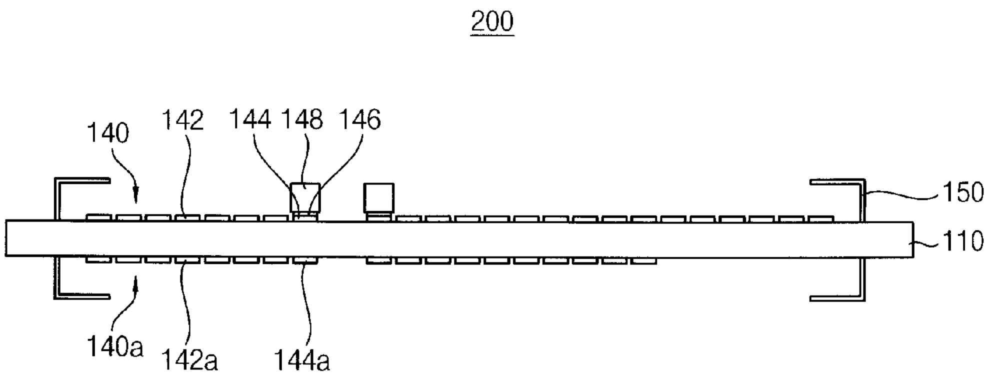

FIG. 13 is a cross-sectional view illustrating a data storage device in accordance with some example embodiments.

Referring to FIG. 13, a data storage device 200 of this example embodiment may include a PCB 110, a first connector 140 and a second connector 140*a*.

The first connector 140 may be arranged on the edge portion of the first surface of the PCB 110. In some example embodiments, the first connector 140 may include elements substantially the same as those of the connector 140 in FIG. 1. Thus, the same reference numerals may refer to the same elements and any further illustrations with respect to the same elements may be omitted herein for brevity.

The second connector 140*a* may be arranged on an edge portion of a second surface of the PCB 110 opposite to the first surface. In some example embodiments, the second connector 140*a* may include elements substantially the same as those of the connector 140*a* in FIG. 7. Thus, the same reference numerals may refer to the same elements and any further illustrations with respect to the same elements may be omitted herein for brevity.

In some example embodiments, the cable may include the SATA cable. Thus, the first connector 140 for the SATA cable may include the guiding members 148 configured to be inserted into the guiding slots of the SATA cable. In contrast, the second connector 140*a* for the μ-SATA cable may not include the guiding members 148*a*. That is, any one of the first connector 140 and the second connector 140*a* may be selectively used in accordance with kinds of the cable.

A method of manufacturing the data storage device 200 may include processes substantially the same as those illustrated with reference to FIGS. 3 to 6 and FIGS. 9 to 12. Thus, any further illustrations with respect to the method may be omitted herein for brevity.

Figure 14:
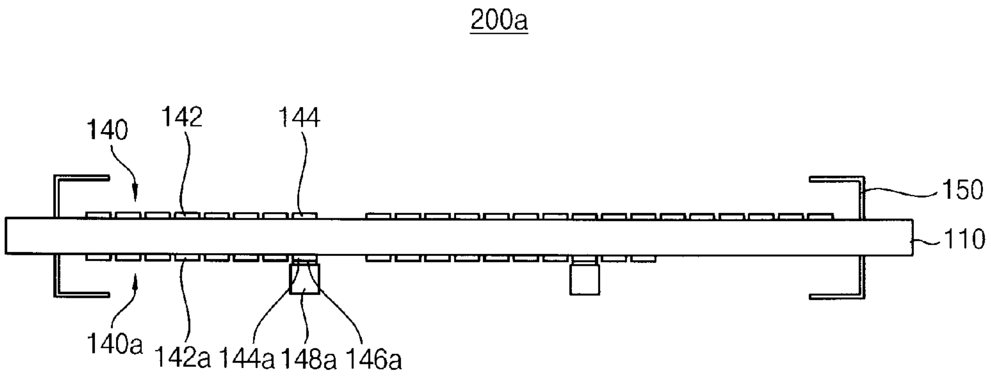

FIG. 14 is a cross-sectional view illustrating a data storage device in accordance with some example embodiments.

Referring to FIG. 14, a data storage device 200*a* of this example embodiment may include a PCB 110, a first connector 140 and a second connector 140*a*.

The first connector 140 may be arranged on the edge portion of the first surface of the PCB 110. In some example embodiments, the first connector 140 may include elements substantially the same as those of the connector 140 in FIG. 1. Thus, the same reference numerals may refer to the same elements and any further illustrations with respect to the same elements may be omitted herein for brevity.

The second connector 140*a* may be arranged on an edge portion of a second surface of the PCB 110 opposite to the first surface. In some example embodiments, the second connector 140*a* may include elements substantially the same as those of the connector 140*a* in FIG. 7. Thus, the same reference numerals may refer to the same elements and any further illustrations with respect to the same elements may be omitted herein for brevity.

In some example embodiments, the cable may include the μ-SATA cable. Thus, the first connector 140 for the SATA cable may not include the guiding members 148*e*. In contrast, the second connector 140*a* for the μ-SATA cable may include the guiding members 148*a* configured to be inserted into the guiding slots of the μ-SATA cable. That is, any one of the first connector 140 and the second connector 140*a* may be selectively used in accordance with kinds of the cable.

A method of manufacturing the data storage device 200*a* may include processes substantially the same as those illustrated with reference to FIGS. 3 to 6 and FIGS. 9 to 12. Thus, any further illustrations with respect to the method may be omitted herein for brevity.

According to these example embodiments, the guiding member may be readily formed by arranging an insulating layer on the dummy tab. Thus, the data storage device without a separate connector may be manufactured by a relatively simple process at a lower cost.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A data storage device comprising:

a printed circuit board (PCB) including a memory chip mounted thereon;

a first connection tab formed on a first surface of the PCB, the first connection tab configured to electrically connect the PCB with a first cable;

a first dummy tab formed on the first surface of the PCB; and a first guiding member formed on the first dummy tab, the first guiding member configured to guide an insertion direction of the first cable.

2. The data storage device of claim 1, wherein the first dummy tab comprises a material substantially the same as that of the first connection tab.

3. The data storage device of claim 1, wherein the first guiding member comprises an insulating material.

4. The data storage device of claim 1, wherein the first cable comprises a serial advanced technology attachment (SATA) cable, and the first guiding member comprises a pair of guides arranged adjacent to each other.

5. The data storage device of claim 1, wherein the first cable comprises a micro serial advanced technology attachment (μ-SATA) cable, and the first guiding member comprises a pair of guides arranged at both sides of the first connection tab.

6. The data storage device of claim 1, further comprising:

a second connection tab formed on a second surface of the PCB opposite to the first surface, the second connection tab configured to electrically connect the PCB with a second cable different from the first cable; and a second dummy tab formed on the second surface of the PCB.

7. The data storage device of claim 6, further comprising:

a second guiding member selectively formed on the second dummy tab, the second guiding member configured to guide an insertion direction of the second cable.

8. The data storage device of claim 6, wherein the first cable comprises a SATA cable, and the second cable comprises a μ-SATA cable.

9. The data storage device of claim 1, further comprising:

a housing formed on the PCB, the housing configured to receive the first cable.

10. A data storage device comprising:

a printed circuit board (PCB) including a memory chip mounted thereon; and a connector integrally formed with the PCB to electrically connect the PCB with a micro serial advanced technology attachment (μ-SATA) cable, the connector including, a connection tab formed on the PCB, the connection tab configured to electrically connect the PCB with the μ-SATA cable;

a dummy tab formed on the PCB; and a guiding member formed on the dummy tab, the guiding member configured to guide an insertion direction of the μ-SATA cable.

11. The data storage device of claim 10, further comprising:

a housing formed on the PCB, the housing arranged at both sides of the connector.

12. The data storage device of claim 11, wherein the guiding member includes a pair of guides arranged adjacent to each other within edges of the housing.

13. A data storage device comprising:

a first connection tab and a first dummy tab formed on a first surface of a printed circuit board (PCB), the first connection tab configured to electrically connect the PCB with a first cable; and a first guiding member formed on the first dummy tab, the first guiding member made of an insulating material and configured to guide an insertion direction of the first cable.

14. The data storage device of claim 13, wherein the first dummy tab comprises a material substantially the same as that of the first connection tab.

15. The data storage device of claim 13, wherein the first cable comprises a serial advanced technology attachment (SATA) cable, and the first guiding member comprises a pair of guides arranged adjacent to each other.

16. The data storage device of claim 13, wherein the first cable comprises a micro serial advanced technology attachment (μ-SATA) cable, and the first guiding member comprises a pair of guides arranged at both sides of the first connection tab.

17. The data storage device of claim 13, further comprising:

a second connection tab and a second dummy tab formed on a second surface of the PCB opposite to the first surface, the second connection tab configured to electrically connect the PCB with a second cable different from the first cable; and a second guiding member selectively formed on the second dummy tab, the second guiding member configured to guide an insertion direction of the second cable.

18. The data storage device of claim 17, wherein the first cable comprises a serial advanced technology attachment (SATA) cable, and the second cable comprises a micro serial advanced technology attachment (μ-SATA) cable.

* * * * *